United States Patent
Basker et al.

(10) Patent No.: US 9,530,698 B1
(45) Date of Patent: Dec. 27, 2016

(54) METHOD AND STRUCTURE FOR FORMING FINFET CMOS WITH DUAL DOPED STI REGIONS

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Singerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/968,230

(22) Filed: Dec. 14, 2015

Related U.S. Application Data

(63) Continuation of application No. 14/834,789, filed on Aug. 25, 2015.

(51) Int. Cl.
  *H01L 21/8238* (2006.01)
  *H01L 21/324* (2006.01)
  *H01L 21/225* (2006.01)

(52) U.S. Cl.
  CPC ... *H01L 21/823821* (2013.01); *H01L 21/2256* (2013.01); *H01L 21/324* (2013.01)

(58) Field of Classification Search
  CPC .......... H01L 29/66803; H01L 21/823821; H01L 21/8242; H01L 27/1211; H01L 29/1054; H01L 29/66795; H01L 29/49; H01L 21/84
  See application file for complete search history.

(56) References Cited

U.S. PATENT DOCUMENTS

2013/0112982 A1* 5/2013 Forbes .................. B82Y 10/00
 257/66

FOREIGN PATENT DOCUMENTS

WO  WO 2014204477 A1 * 12/2014 ..... H01L 21/823821

OTHER PUBLICATIONS

Basker, Veeraraghavan, et al.; "Method and Structure for Forming FinFET CMOS With Dual Doped STI Regions"; U.S. Appl. No. 14/834,789, filed Aug. 25, 2015.
List of IBM Patents or Patent Applications Treated as Related—Date Filed: May 11, 2016; 1 page.

* cited by examiner

*Primary Examiner* — Alexander Ghyka
*Assistant Examiner* — Abdulfattah Mustapha
(74) *Attorney, Agent, or Firm* — Cantor Colburn LLP; Vazken Alexanian

(57) ABSTRACT

A method of making a semiconductor device includes forming a first fin of a first transistor in a substrate; forming a second fin of a second transistor in the substrate; disposing a first doped oxide layer including a first dopant onto the first fin and the second fin, the first dopant being an n-type dopant or a p-type dopant; disposing a mask over the first fin and removing the first doped oxide layer from the second fin; removing the mask and disposing a second doped oxide layer onto the first doped oxide layer over the first doped oxide layer covering the first fin and directly onto the second fin, the second doped oxide layer including an n-type dopant or a p-type dopant that is different than the first dopant; and annealing to drive in the first dopant into a portion of the first fin and the second dopant into a portion of the second fin.

15 Claims, 18 Drawing Sheets

METHOD AND STRUCTURE FOR FORMING FINFET CMOS WITH DUAL DOPED STI REGIONS

DOMESTIC PRIORITY

This application is a continuation of U.S. patent application Ser. No. 14/834,789, filed Aug. 25, 2015, the disclosure of which is incorporated by reference herein in its entirety.

BACKGROUND

The present invention relates to metal-oxide-semiconductor field-effect transistors (MOSFET), and more specifically, to fin-type field-effect transistors (FinFET).

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

The FinFET is a type of MOSFET. The FinFET is a double-gate or multiple-gate MOSFET device that mitigates the effects of short channels and reduces drain-induced barrier lowering. The "fin" refers to the narrow channel between source and drain regions. A thin dielectric layer on either side of the fin separates the fin channel from the gate.

SUMMARY

According to an embodiment, a method of making a semiconductor device includes forming a first fin of a first transistor in a substrate; forming a second fin of a second transistor in the substrate; disposing a first doped oxide layer including a first dopant onto the first fin and the second fin, the first dopant being an n-type dopant or a p-type dopant; disposing a mask over the first fin and removing the first doped oxide layer from the second fin; removing the mask and disposing a second doped oxide layer onto the first doped oxide layer over the first doped oxide layer covering the first fin and directly onto the second fin, the second doped oxide layer including an n-type dopant or a p-type dopant that is different than the first dopant; and annealing to drive in the first dopant into a portion of the first fin and the second dopant into a portion of the second fin.

According to another embodiment, a method of making a semiconductor device includes forming a first fin of a first transistor in a substrate; forming a second fin of a second transistor in the substrate; disposing a first doped oxide layer including a first dopant onto the first fin and the second fin, the first dopant being an n-type dopant or a p-type dopant; disposing a mask over the first fin and removing the first doped oxide layer from the second fin; removing the mask and disposing a second doped oxide layer onto the first doped oxide layer over the first fin and directly onto the second fin, the second doped oxide layer including an n-type dopant or a p-type dopant that is different than the first dopant; recessing the first doped oxide and the second doped oxide to form a first doped oxide spacer along a sidewall of the first fin and a second doped oxide spacer along a sidewall of the second fin; and annealing to drive in the first dopant into a portion of the first fin and the second dopant into a portion of the second fin.

Yet, according to another embodiment, a semiconductor device includes a first transistor including a first fin patterned in a substrate, the first fin including a first doped region including a first dopant, the first dopant being an n-type dopant or a p-type dopant; a first doped oxide spacer disposed along a portion of a sidewall of the first fin adjacent to the first doped region and including the first dopant; a second doped oxide spacer disposed over the first doped oxide spacer and including a second dopant, the second dopant being different than the first dopant; a second transistor including a second fin patterned in the substrate, the second fin including a second doped region including the second dopant; and a third doped oxide spacer disposed along a portion of a sidewall of the second fin adjacent to the second doped region of the second fin and including the second dopant.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-8 illustrate an exemplary method of making a semiconductor device according to a first embodiment of the present invention, in which:

FIG. 1A is a cross-sectional side view of NFET (first transistor) and PFET (second transistor) fins patterned in a substrate;

FIG. 2 is a cross-sectional side view after depositing a conformal layer of a p-doped oxide (first doped oxide) over the fins;

FIG. 3 is a cross-sectional side view after covering the NFET with a mask and removing the p-doped oxide (oxide doped with p-type dopants) from around the PFET fins;

FIG. 4 is a cross-sectional side view after removing the mask and depositing a conformal layer of n-doped oxide (second doped oxide doped with n-type dopants) over the fins;

FIG. 5 is a cross-sectional side view after annealing to drive the dopants into the fins and the substrate;

FIG. 6 is a cross-sectional side view after etching to recess the p-doped oxide and the n-doped oxide and leave spacers around a portion of the fins;

FIG. 8 is a cross-sectional side view after forming gates over the fin channels;

FIGS. 9-11 illustrate an exemplary method of making a semiconductor device according to a second embodiment of the present invention, in which:

FIG. 9 is a cross-sectional side view after etching to remove the n-doped oxide and the p-doped oxide from the fins of FIG. 5;

FIG. 10 is a cross-sectional side view after depositing an undoped oxide around the fins, recessing the undoped oxide, and removing the spacers and hard mask;

FIG. 11 is a cross-sectional side view after forming gates around the fin channels;

FIGS. 12-15 illustrate an exemplary method of making a semiconductor device according to a third embodiment of the present invention, in which:

FIG. 12 is a cross-sectional side view after etching to recess the p-doped oxide and the n-doped oxide and leave spacers around a portion of fins of FIG. 4;

FIG. 13 is a cross-sectional side view after annealing to drive in the dopants into the fins and the substrate;

FIG. 14 is a cross-sectional side view after removing the spacers and hard mask and depositing an undoped oxide around the fins; and FIG. 15 is a cross-sectional side view after forming gates over the fin channels.

DETAILED DESCRIPTION

Figure 1A:
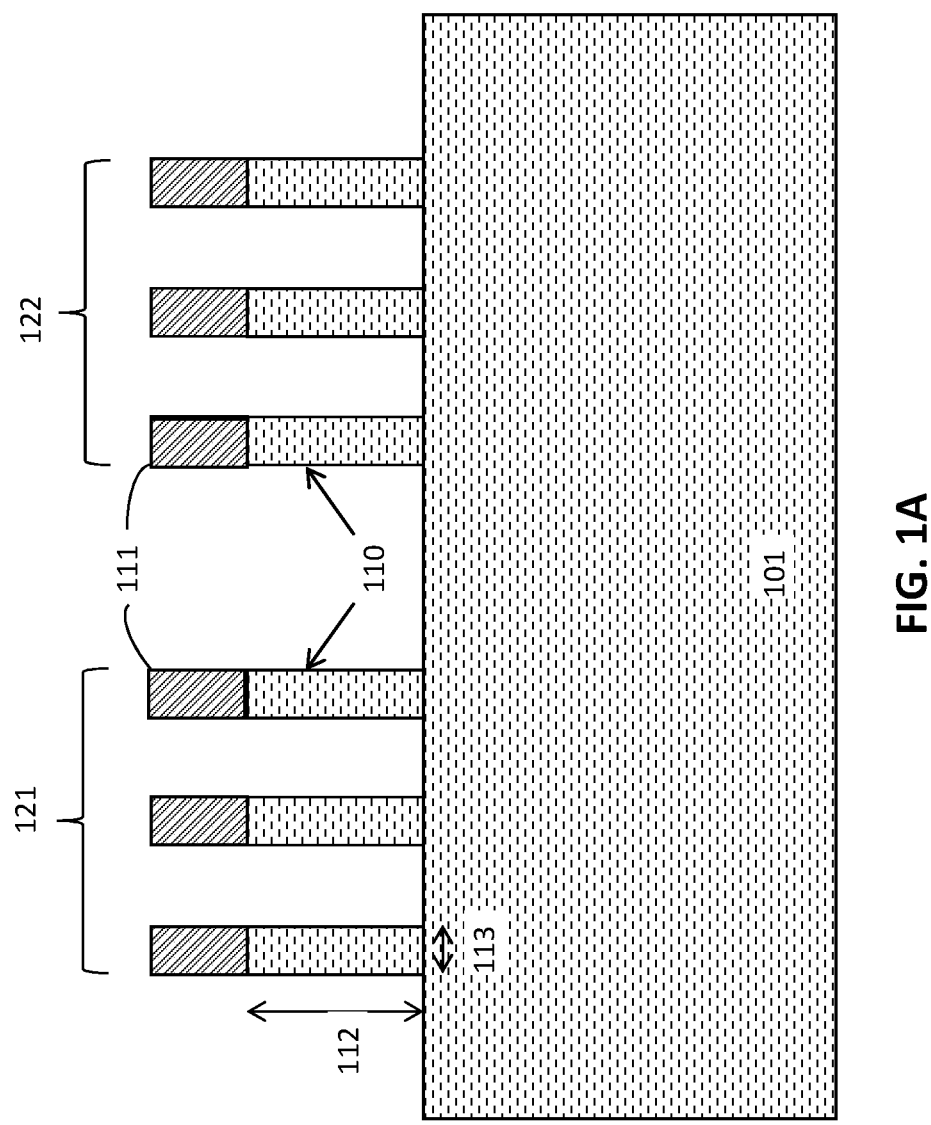

Bulk FinFET transistors may have various drawbacks. For example, punchthrough stop (PTS) doping (substrate doping) may be necessary under the fin channel region to prevent source/drain punch-through. Alignment of the gate, shallow trench isolation (STI) regions, and PTS doping regions is challenging, despite being an important feature. A high aspect ratio fin structure also may pose challenges for patterning.

Accordingly, embodiments of the present invention provide methods of making semiconductor devices with a dual doped STI liner. The methods only need a single mask for patterning. The methods do not include etching materials through the entire depth of high aspect ratio STIs. The methods also do not include depositing a capping layer onto the doped oxide. Embodiments of the inventive structure and methods are suitable for highly scaled fin pitch devices. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIGS. 1A-8 illustrate an exemplary method of making a semiconductor device according to a first embodiment. FIG. 1A is a cross-sectional side view of NFET 121 (first transistor) and PFET 122 (second transistor) fins 110 patterned in a substrate 101. In other embodiments, the NFET 121 is a first transistor, and the PFET 122 is a second transistor. The first and second transistors are different transistors. The fins 110 within each transistor (NFET 121 and PFET 122) are arranged in a fin array. Each first and second transistor includes one fin, two fins, or an array of fins.

Non-limiting examples of suitable substrate 101 materials include silicon, sapphire, germanium, gallium arsenide, silicon germanium, indium arsenide, indium phosphide, or any combination thereof. In some embodiments, the substrate 101 material of the NFET 121 is the same or different than the substrate material of the PFET 122. In other embodiments, the substrate 101 material forming the fins 110 in the NFET 121 is silicon, and the substrate 101 material forming the fins 110 in the PFET 122 is silicon germanium.

The thickness of the substrate 101 is not intended to be limited. In one aspect, the thickness of the substrate 101 is in a range from about 0.3 millimeters (mm) to about 1.5 mm. In another aspect, the thickness of the substrate 101 is in a range from about 0.5 mm to about 0.75 mm.

The fins 110 may be formed in the substrate 101 by depositing a hard mask 111 material over a bulk substrate 101. Non-limiting examples of suitable materials for the hard mask 111 include silicon oxide, silicon nitride, or any combination thereof. The fins 110 are patterned in the NFET 121 and PFET 122 regions by, for example, sidewall imaging transfer.

In some aspects, the fins 110 have a height 112 in a range from about 20 nanometers (nm) to about 100 nm and a width 113 in a range from about 4 nm to about 30 nm. In other aspects, the fins 110 have a height 112 in a range from about 25 nm to about 50 nm and a width 113 in a range from about 6 nm to about 10 nm.

The thickness of the hard mask 111 over the fins 110 may generally vary and is not intended to be limited. In some aspects, the thickness of the hard mask 111 is in a range from about 10 nm to about 100 nm. In other aspects, the thickness of the hard mask 111 over the fins 110 is in a range from about 25 nm to about 50 nm.

Figure 1B:
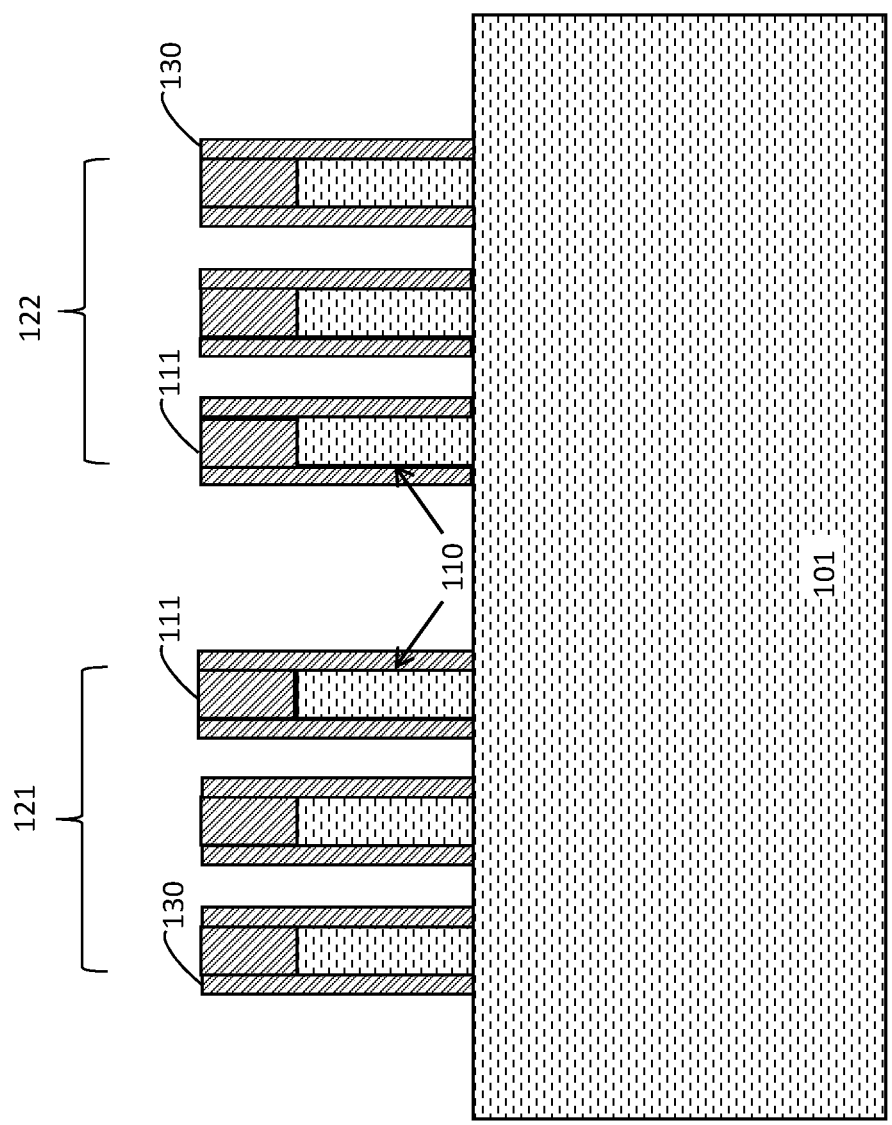
FIG. 1B is a cross-sectional side view after forming dielectric spacers along fin sidewalls.

FIG. 1B is a cross-sectional side view after forming spacers 130 along fin 110 sidewalls. Non-limiting examples of suitable materials for the spacers 130 include dielectric materials, for example, dielectric oxides (e.g., silicon oxide), dielectric nitrides (e.g., silicon nitride), dielectric oxynitrides, or any combination thereof. The spacer 130 material is deposited by a deposition process, for example, chemical vapor deposition (CVD) or physical vapor deposition (PVD). The spacer 130 material may be etched by a dry etch process, for example, a reactive ion etching (RIE) process.

The thickness of the spacers 130 may generally vary and is not intended to be limited. In some aspects, the thickness of the spacers 130 is in a range from about 2 nm to about 15 nm. In other aspects, the thickness of the spacers 130 is in a range from about 4 nm to about 8 nm.

Figure 1C:
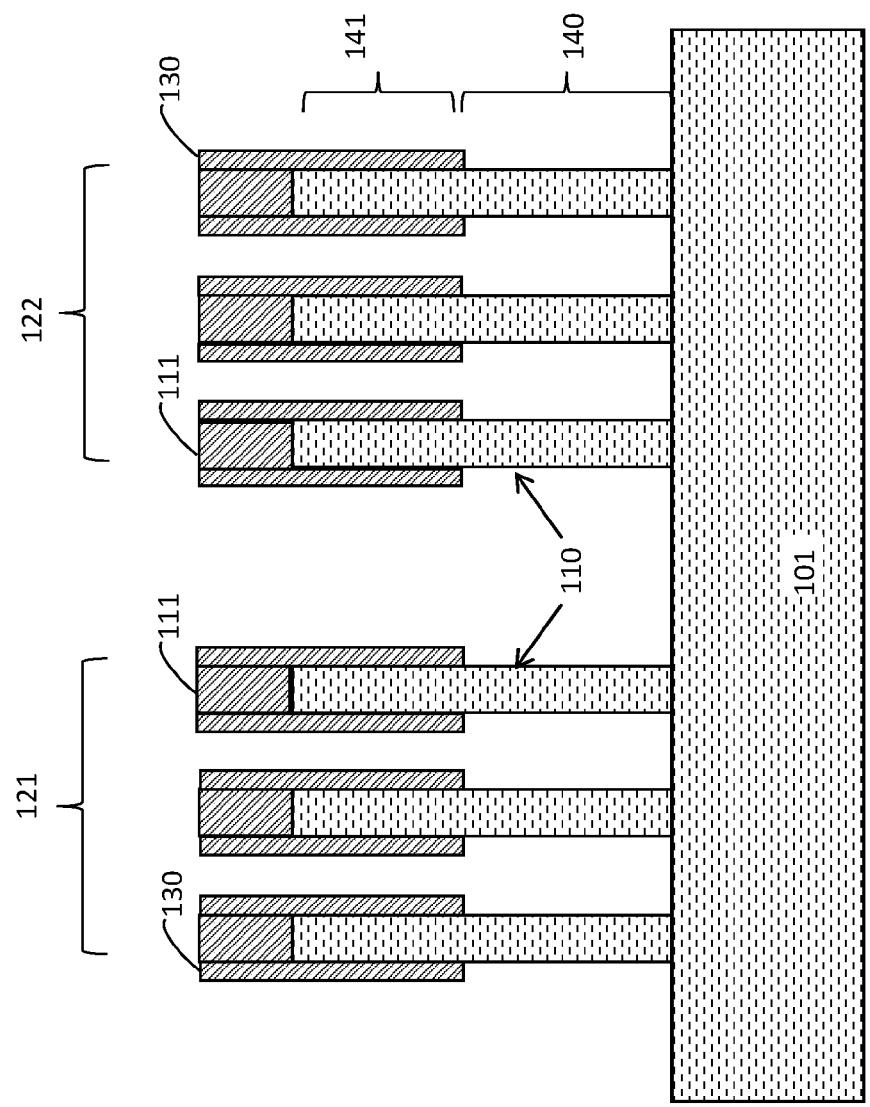
FIG. 1C is a cross-sectional side view after etching back the substrate around the fins.

FIG. 1C is a cross-sectional side view after removing a portion of the substrate 101 material around the fins 110. The etching process employed may be a dry etching process, for example, an RIE process. The substrate 110 is etched to leave a gap region 140 between the spacers 130 and the substrate 101. The fins 110 may be etched to have sidewalls that are substantially parallel or tapered. Or the fins 110 may be etched to be wider or narrower in the gap region 140 compared to the region 141 lined by the spacers 130.

Figure 2:
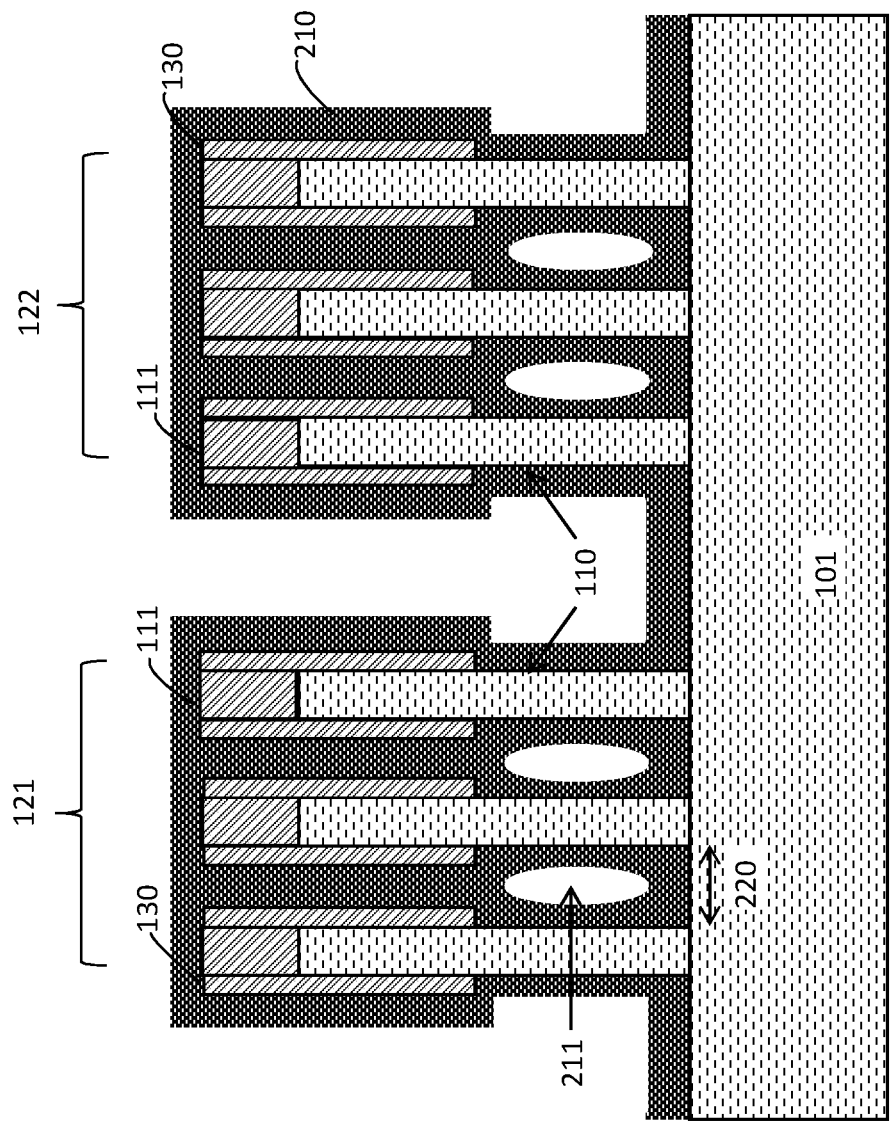

FIG. 2 is a cross-sectional side view after depositing a conformal layer of a p-doped oxide 210 (first doped oxide) over the fins 110 of the NFET 121 (first transistor) and the PFET 122 (second transistor). The p-doped oxide 210 includes an oxide material that is doped with a p-type dopant (e.g., boron) (first dopant). Non-limiting examples of suitable oxides include but are not limited to, silicon dioxide, spin-on-glass, a flowable oxide, a high density plasma oxide, or any combination thereof.

In some embodiments, the first dopant is an n-type dopant, which depends on the type of transistor. The n-doped oxide may include phosphorus doped oxide or arsenic doped oxide. The p-doped oxide 210 may include boron doped oxide. In other embodiments, p-doped oxide 210 may be any doped oxide, which depends on the type(s) of transistors.

The p-doped oxide 210 (first doped oxide) forms gaps in regions 211 between the fins 110. The regions 211 are voids that form when the distance 220 between the fins 110 is large enough. To form the regions 211, the thickness of the p-doped oxide 210 layer is greater than half the distance 220 between the fins 110. For a 7 nm node, for example, the distance 220 is about 20 nm, with the fin 110 pitch being about 27 nm and the fin width being about 7 nm). A 10 nm thick layer of the p-doped oxide 210 will then pinch off to form the voids in region 211.

The p-doped oxide 210 may be formed by a suitable deposition process. Non-limiting examples of suitable deposition methods include chemical vapor deposition (CVD), atomic layer deposition (ALD), plasma enhanced CVD (PECVD), low pressure CVD (LPCVD), or any other suitable deposition techniques.

In some embodiments, the distance 220 between the fins 110 is in a range from about 10 nm and about 100 nm. In other embodiments, the distance 220 between the fins 110 is in a range from about 15 nm to about 30 nm.

In some embodiments, the thickness of the p-doped oxide 210 is in a range from about 3 nm to about 30 nm. In other embodiments, the thickness of the p-doped oxide 210 is in a range from about 5 nm to about 15 nm.

Figure 3:
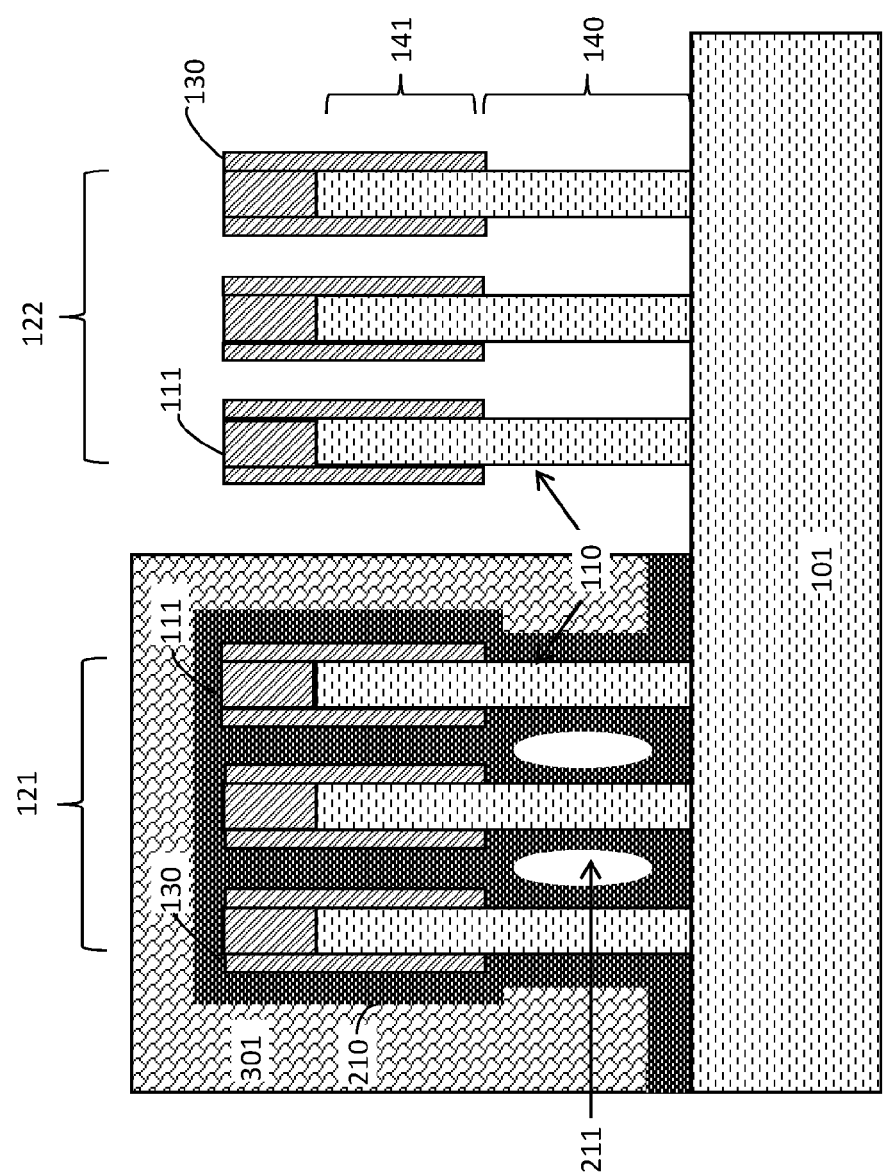

FIG. 3 is a cross-sectional side view after covering the NFET 121 region with a mask 301 and removing the p-doped oxide 210 from around the PFET 122 fins 110. Lithography or any other suitable patterning technique can be used to form the mask 301. The mask 301 may be, for example, an organic planarizing layer (OPL) resist. The mask 301 protects the NFET 121 region (first transistor).

Initially, the thicker portion of the p-doped oxide 210 is recessed in the region 140 beneath the spacers 130. The p-doped oxide 210 may be recessed by performing a dry etching process, for example, an RIE process. The dry etching process is employed to recess the p-doped oxide 210 by an amount in a range from about 15 to about 60 nm, or by an amount in a range from about 30 to about 40 nm.

An isotropic etching process, for example, a wet etch process containing hydrofluoric acid, is then employed to remove the thinner portion of the p-doped oxide layer in the region 141 over the spacers 130.

Figure 4:
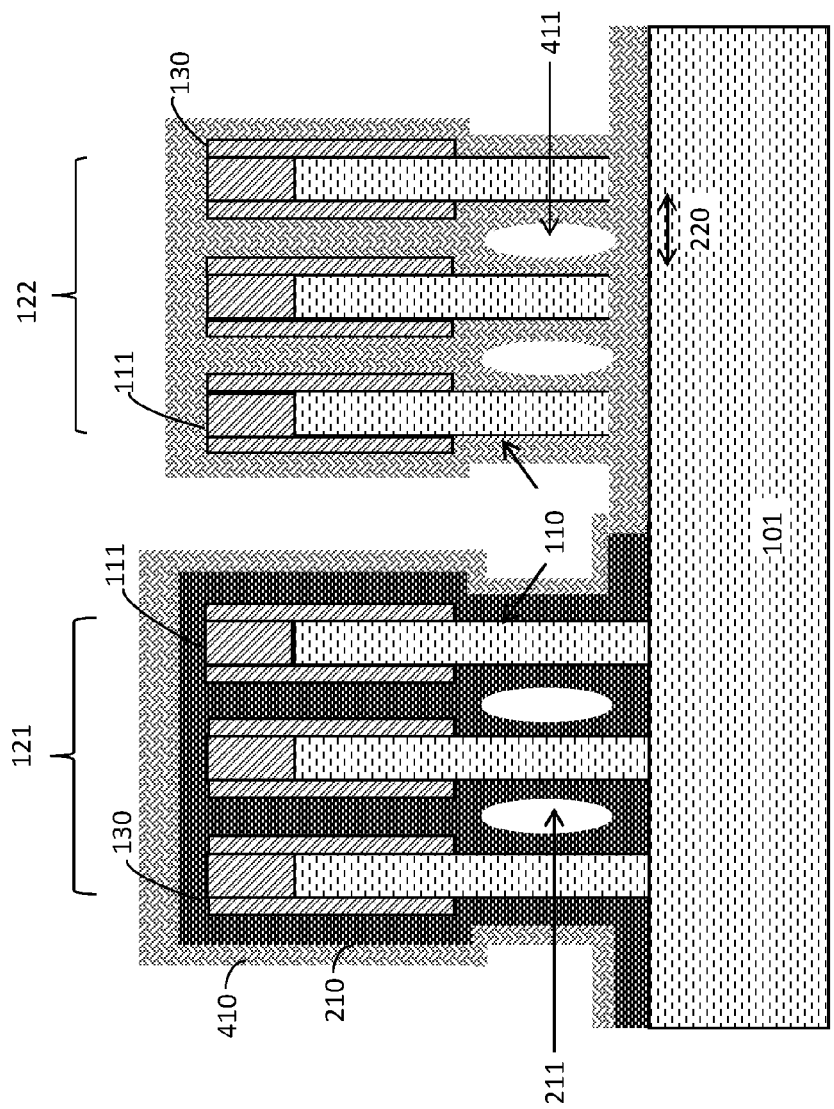

FIG. 4 is a cross-sectional side view after removing the mask 301 and depositing a conformal layer of n-doped oxide 410 (second doped oxide) over the fins 110. The mask 301 may be stripped away by ashing.

The n-doped oxide 410 (second doped oxide) is deposited over the p-doped oxide 210 (first doped oxide) over the NFET 121 (first transistor) and directly onto the fins 110 of the PFET 122 (second transistor). The layer of the p-doped oxide 210 over the NFET 121 acts as a mask to protect the NFET 121, which means that the n-doped oxide 410 does not need to be removed from the NFET 121 region. A second mask is not required to form transistors that are doped with different dopants.

The n-doped oxide 410 (second doped oxide) includes an oxide material that is doped with an n-type dopant (e.g., phosphorus or arsenic) (second dopant). In some embodiments, the second dopant of second doped oxide is an n-type dopant or a p-type dopant that is different than the first dopant of the first doped oxide. The p-doped oxide 210 may be phosphorus doped oxide. In other embodiments, n-doped oxide 410 may be any doped oxide, which depends on the type(s) of transistors.

The n-doped oxide 410 (second doped oxide) forms gaps in the region 411 between the fins 110. The regions 411 are voids that naturally form when the distance 220 between the fins 110 is large enough, as described above for the regions 211 in FIG. 2. The n-doped oxide 410 may be formed as described above for the p-doped oxide 210 also in FIG. 2.

In one embodiment, the NFET 121 (first transistor) includes a first fin 110, and the PFET 122 (second transistor) includes a second fin 110. The NFET 121 or the PFET 122 includes a third fin 110 adjacent to the first or second fin 110, and the first doped oxide layer 210 or the second doped oxide layer 410 pinches off between the third fin 110 and either the first or second fin 110.

Figure 5:
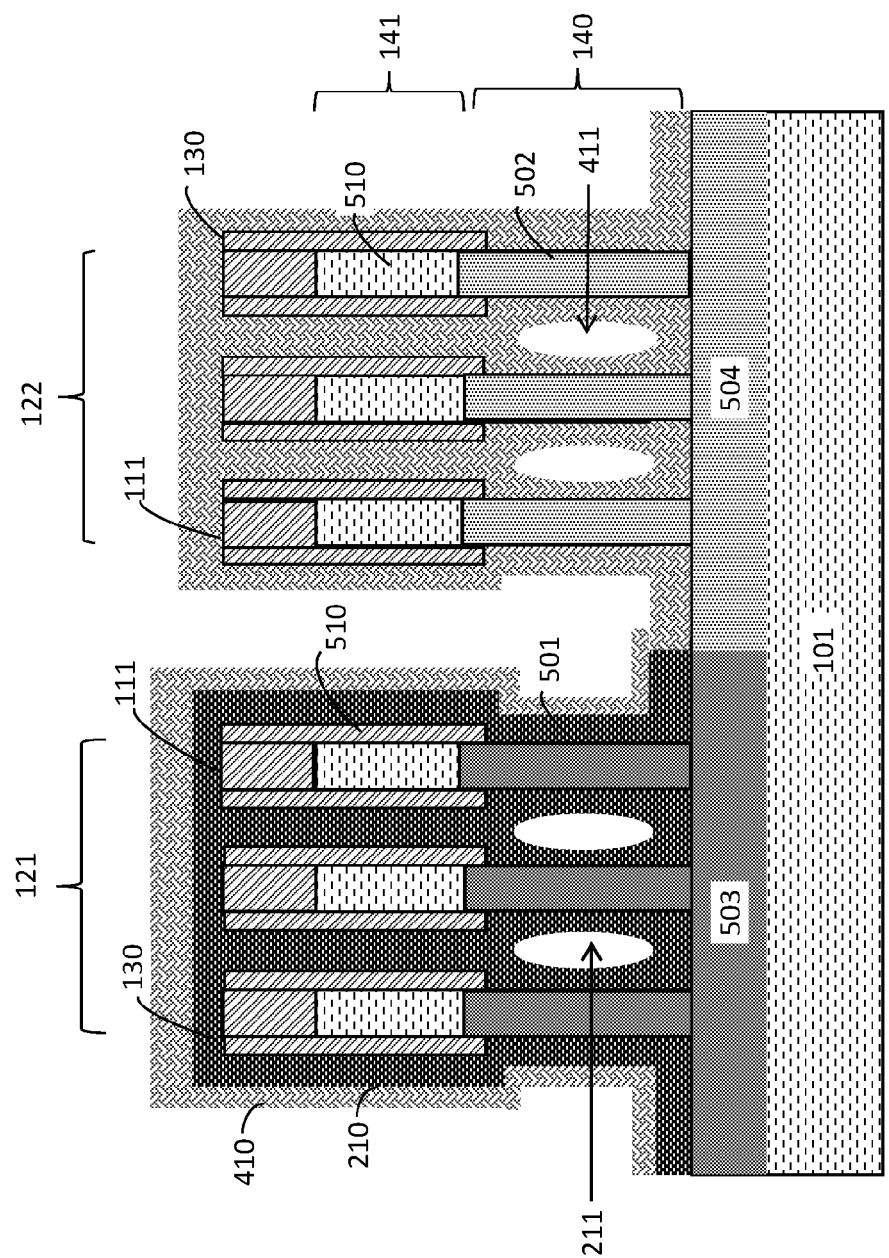

FIG. 5 is a cross-sectional side view after annealing to drive the dopants into the fins 110 and the substrate 101. A thermal annealing process drives the p-type dopants and the n-type dopants of the p-doped oxide 210 and the n-doped oxide 410, respectively, into the exposed fin regions to form doped fin regions 501, 502. The dopants diffuse at least a few nanometers into the fins 110 to form the doped fin regions 501, 502. The dopants are also driven into the substrate 101 to form corresponding doped substrate regions 503, 504. The doped fin regions 501, 502 and doped substrate regions 503, 504 form the punchthrough stopping (PTS) regions.

In the NFET 121, the doped fin regions 501 and doped substrate regions 503 will be doped with the type of dopant within the overlaying doped oxide layer. For example, the p-type dopants from the p-doped oxide 210 will be driven into fins 110 and substrate 101 of the NFET 121. As long as the p-doped oxide 210 is thick enough to block the n-type dopants from the overlaying n-doped oxide 410, no cross doping from the n-doped oxide 410 will occur. The n-type dopants from the n-doped oxide 410 will be driven into the fins 110 and substrate 101 of the PFET 122. The doped substrate regions 503, 504 include a gradient dopant profile.

The fin channels 510 are protected by the spacers 130 and remain undoped. The spacers 130 function as a diffusion barrier in the region 141 of the fins 110. Thus, the dopants are only driven into the fins 110 in the region 140 not protected by the spacers 130.

Figure 7A:
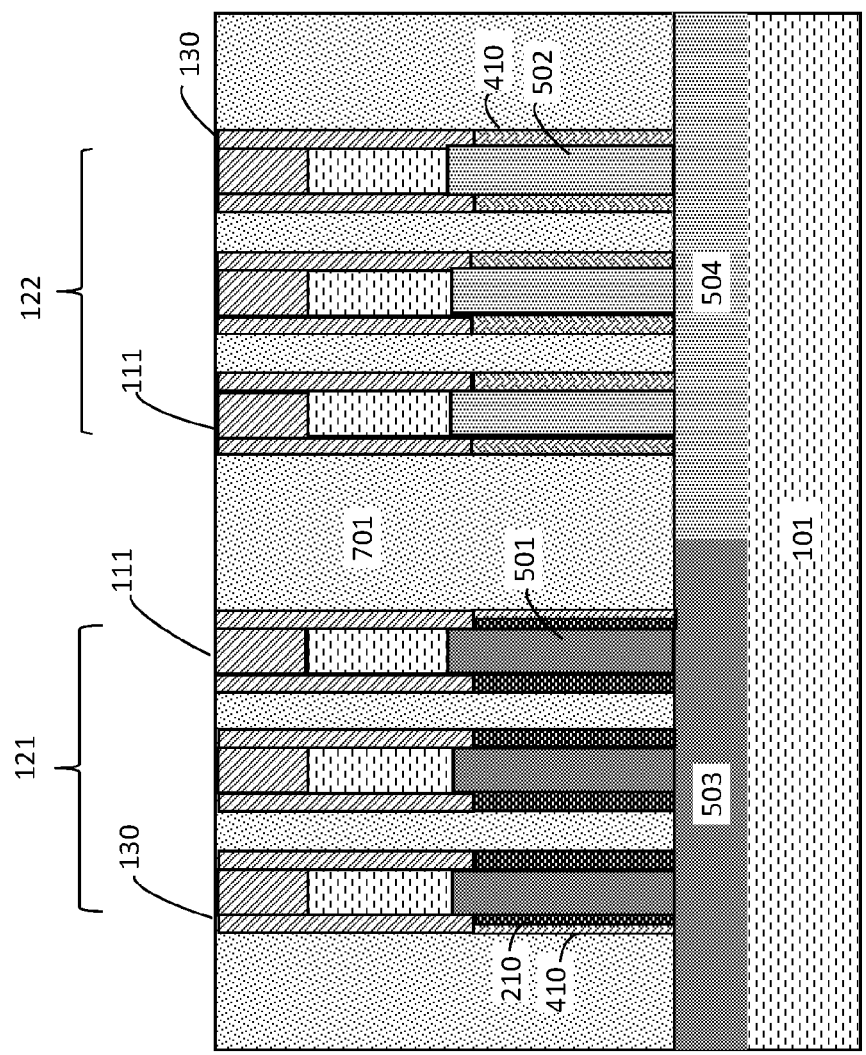
FIG. 7A is a cross-sectional side view after depositing an undoped oxide around the fins.

In another embodiment (not shown), the annealing to drive in the dopants may be performed after depositing an undoped oxide around and between the fins 110 (see FIG. 7A).

Figure 6:
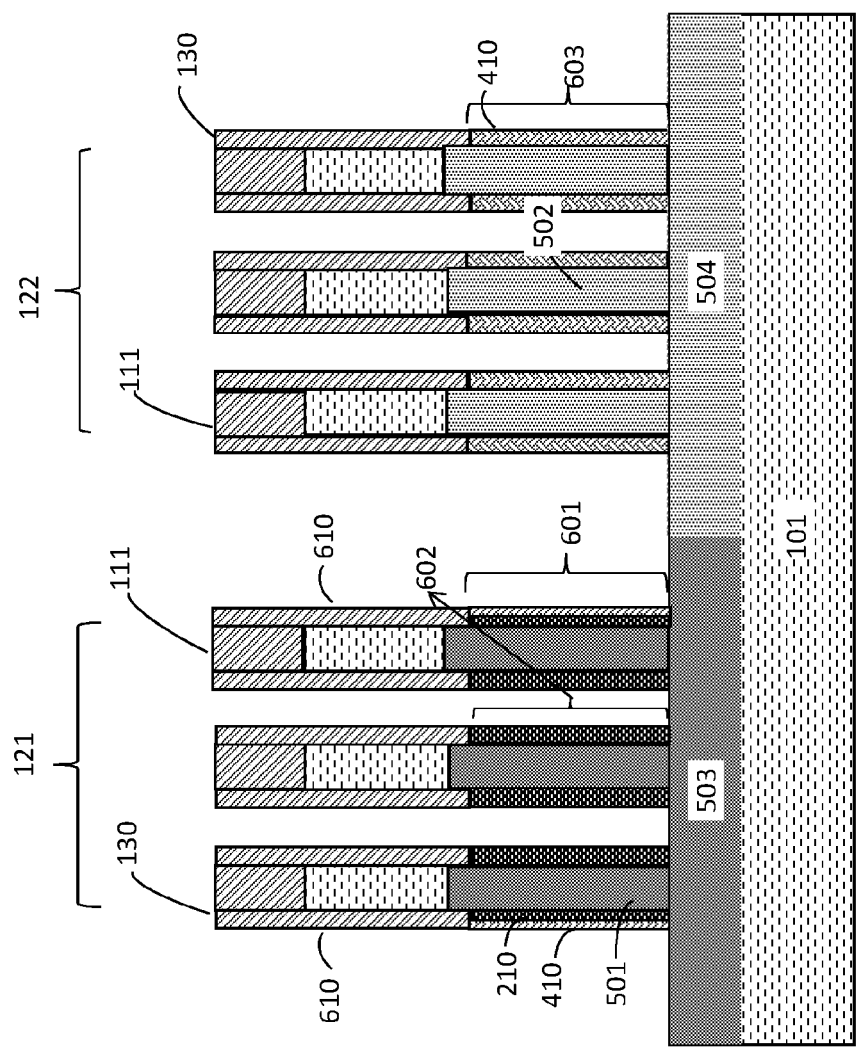

FIG. 6 is a cross-sectional side view after etching to recess the p-doped oxide 210 and the n-doped oxide 410 and leave spacers 601, 602, and 603 around the fins 110. The spacers 601, 602, and 603 line the fin 110 sidewalls in the region between the spacer 130 and the doped substrate regions 503 and 504. A directional etching process, for example, an RIE process is performed to form the spacers 601, 602, and 603. The thickness of the spacers 601, 602, and 603 is partially defined by the thickness of the spacers 130.

Two types of spacers form in the NFET 121 (first transistor) region. Spacer 601 is a double layer (bilayer) spacer including two doped oxides, p-doped oxide 210 and n-doped oxide 410. Spacer 601 forms along outer sidewalls (one portion) of the outermost fins 610 in the array of fins. The single layer spacer 602, which includes the p-doped oxide 210 lines the remaining fin 110 sidewalls (along another portion). An advantage of using methods that form the double layer spacer 601 is that only one mask (mask 301 in FIG. 3) must be used to form different doped fin regions 501, 502 and substrate doped regions 503, 504 as shown in FIG. 5. The first doped oxide layer (p-doped oxide 210) functions as a protective mask over the first transistor (NFET 121), as shown in FIG. 4.

One type of spacer forms in the PFET region 122 (second transistor) region. Spacer 603 is a single layer spacer, which includes the n-doped oxide 410.

FIG. 7A is a cross-sectional side view after depositing an undoped oxide 701 around the fins 110, which will form the STI regions between the fins 110. The undoped oxide 701 may be a low-k dielectric oxide, including but not limited to, spin-on-glass, a flowable oxide, a high density plasma oxide, or any combination thereof. The undoped oxide 701 is deposited by a suitable deposition process, including, but not limited to CVD, PVD, plasma enhanced CVD, atomic layer deposition (ALD), evaporation, chemical solution deposition, or like processes. A planarization process, for example, chemical mechanical planarization (CMP), is performed to smooth the surface of updoped oxide 701.

Figure 7B:
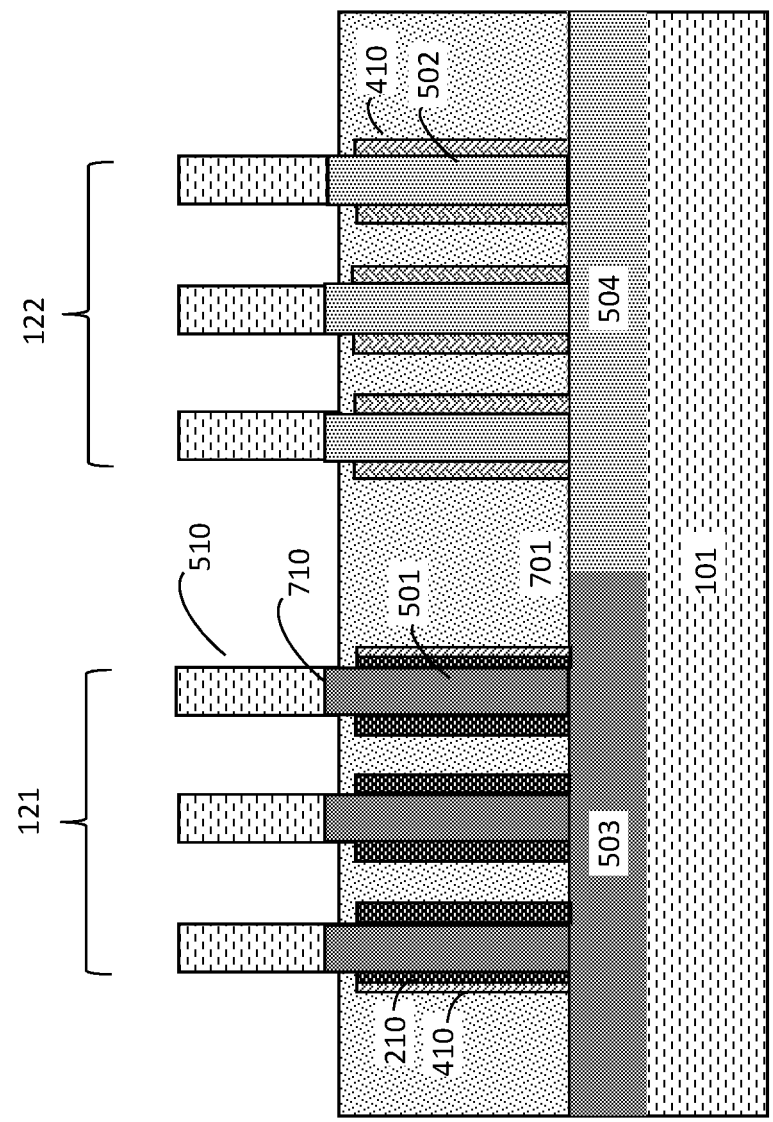
FIG. 7B is a cross-sectional side view after recessing the undoped oxide and removing the spacers and hard mask to expose the fin channels.

FIG. 7B is a cross-sectional side view after recessing the undoped oxide 701 and removing the spacers 130 and hard mask 711 to expose the fin channels 510. The undoped oxide 701 is recessed by an etching process, for example, by oxide ME. The spacers 130 are stripped by, for example, a hot phosphoric acid etch if the spacers and the caps are silicon nitride. The undoped oxide 701 is recessed to a region that is below the interface 710 between the doped fin regions 501, 502 and the fin channels 510.

Figure 8:
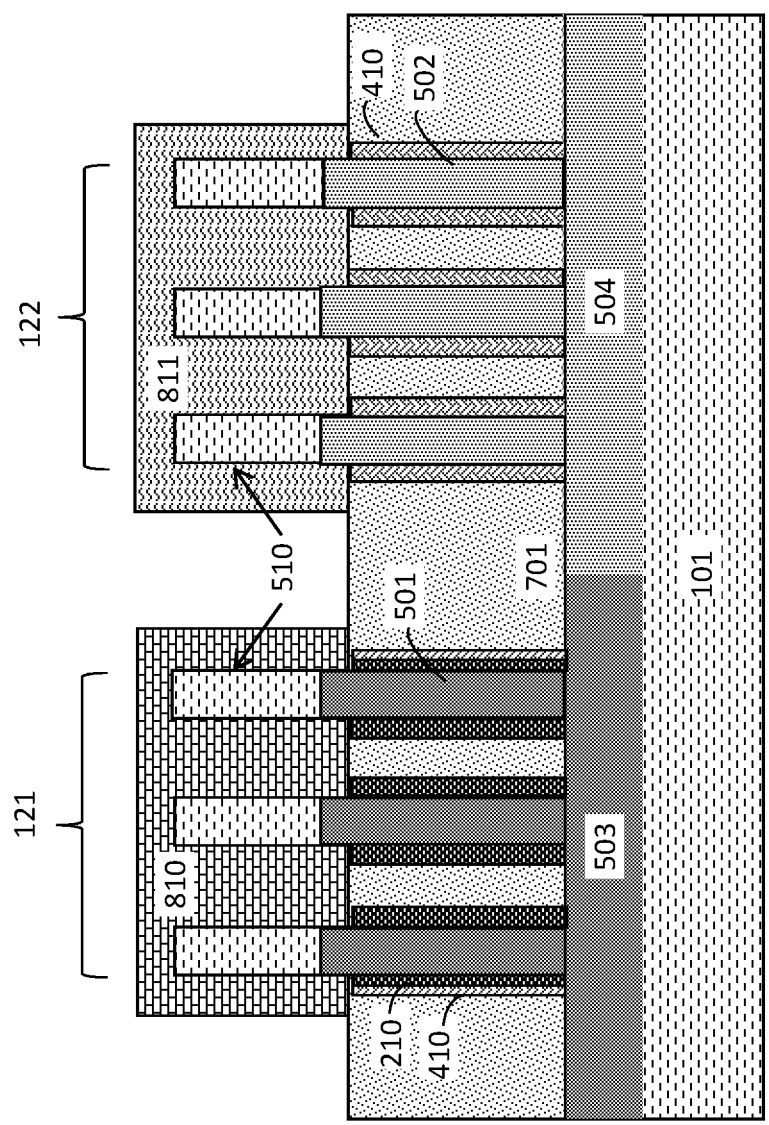

FIG. 8 is a cross-sectional side view after forming gates 810, 811 over the fin channels 510. The gate stacks of the gates 810, 811 are high-k metal gates formed, for example, by depositing one or more high-k dielectric materials, one or more workfunction metals next to high-k dielectric materials, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by known deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The work function metal(s) may be disposed over the high-k dielectric material. The type of work function metal(s) depends on the type of transistor and may differ between the NFET 121 (first transistor) and the PFET 122 (second transistor). Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks of the gates 810, 811. Non-limiting examples of suitable conductive metals include aluminum (Al), platinum (Pt), gold (Au), tungsten (W), titanium (Ti), or any combination thereof. The conductive metal may be deposited by a known deposition process, for example, CVD, PECVD, PVD, plating, thermal or e-beam evaporation, and sputtering. A planarization process, for example, chemical mechanical planarization (CMP), is performed to polish the surface of the conductive gate metal.

Figure 9:
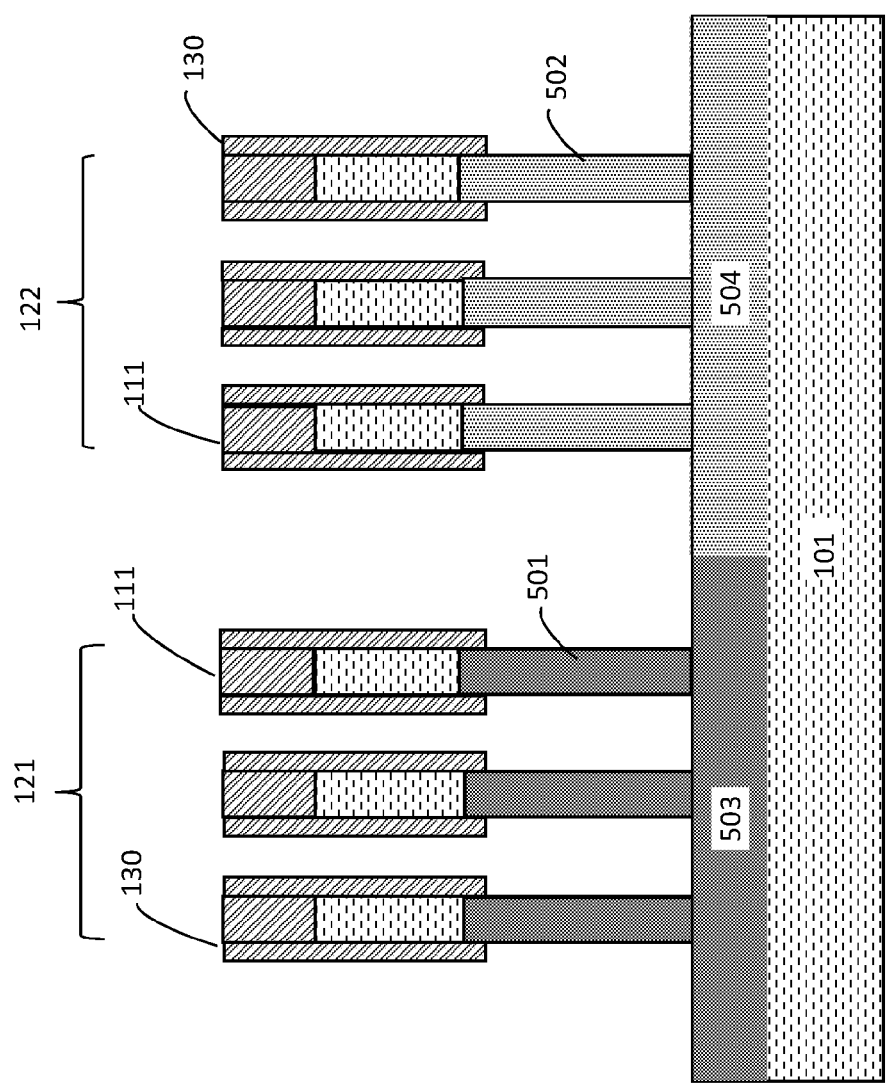
Figure 10:
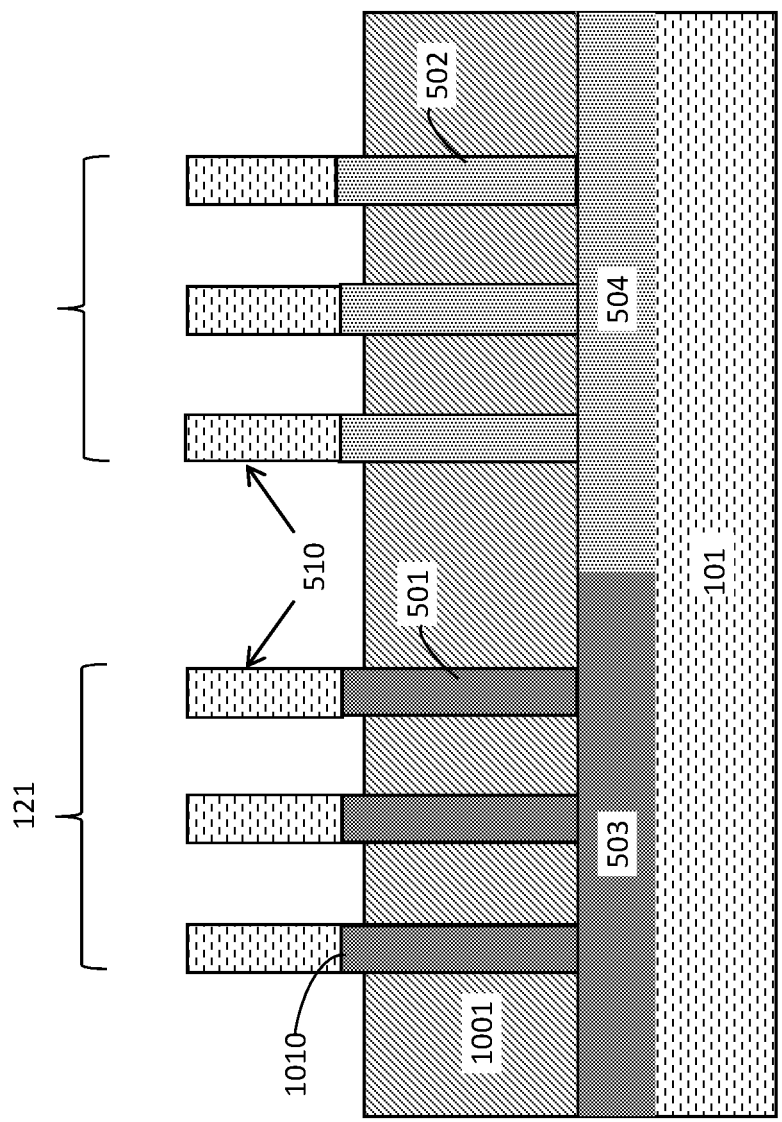
Figure 11:
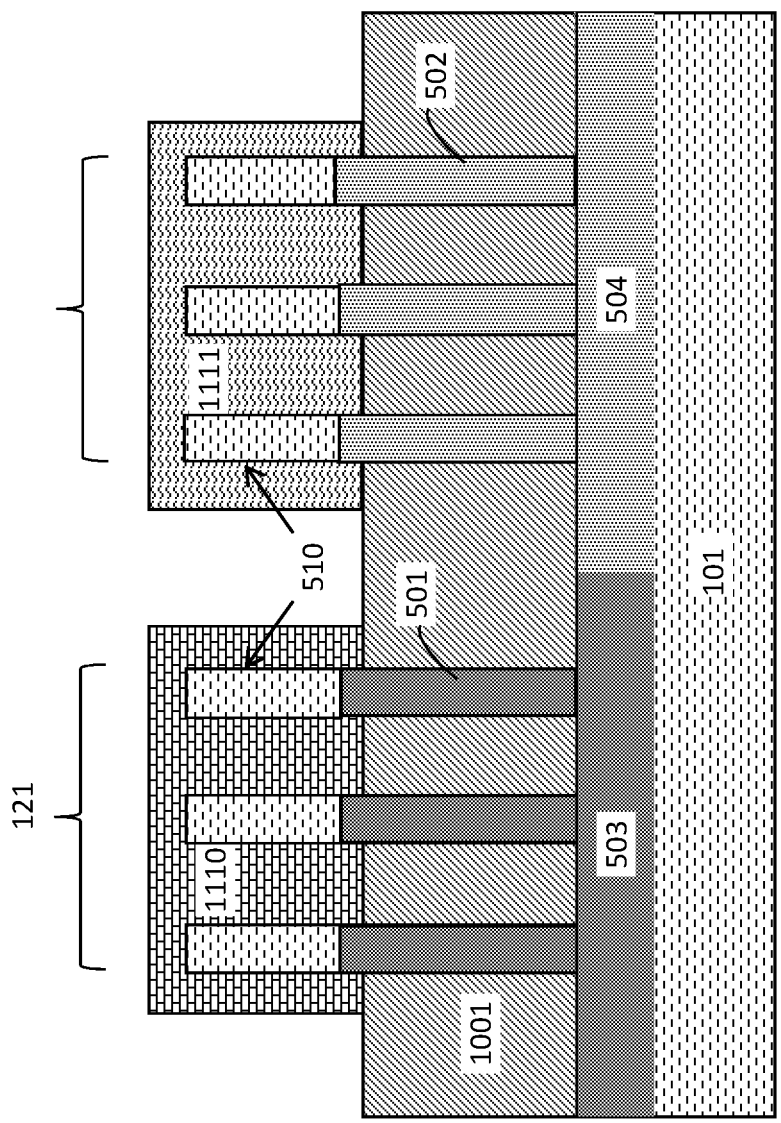

FIGS. 9-11 illustrate an exemplary method of making a semiconductor device according to a second embodiment of the present invention. FIG. 9 is a cross-sectional side view after etching to remove the p-doped oxide 210 (first doped oxide) and the n-doped oxide 410 (second doped oxide) from around the fins 110 of FIG. 5, after annealing to drive in the dopants and form the PTS regions. In contrast to the first embodiment shown in FIG. 6, in which spacers 601, 602, 603 are formed, the p-doped oxide 210 and p-doped oxide 410 are substantially completely removed without forming spacers alongside the doped fin regions 501, 502.

A dry etching process, for example, and RIE process may be used to expose the pinch off regions 211, 411 between the fin doped regions 501, 502, as shown in FIG. 5. An isotropic etching process, for example, a wet etching process containing hydrofluoric acid may then be used to remove the remaining p-doped oxide 210 and n-doped oxide 410.

FIG. 10 is a cross-sectional side view after depositing an undoped oxide 1001 around and between the fins 110 to form STI regions, recessing the undoped oxide 1001, and removing the spacers 130 and hard mask 111. The undoped oxide 1001 may include any suitable materials described above in FIG. 7A for the undoped oxide 701. A planarization process, for example, chemical mechanical planarization (CMP), is performed to smooth the surface of updoped oxide 1001. Following planarization, undoped oxide 1001 is recessed and the spacers 130 and hard mask 111 are stripped as described above in FIG. 7B. The undoped oxide 1001 is recessed to a region that is below the interface 1010 between the doped fin regions 501, 502 and the fin channels 510.

FIG. 11 is a cross-sectional side view after forming gates 1110, 1111 around the fin channels 510. The gates 1110, 1111 may include gate stacks as described above for gates 810, 811 in FIG. 8.

Figure 12:
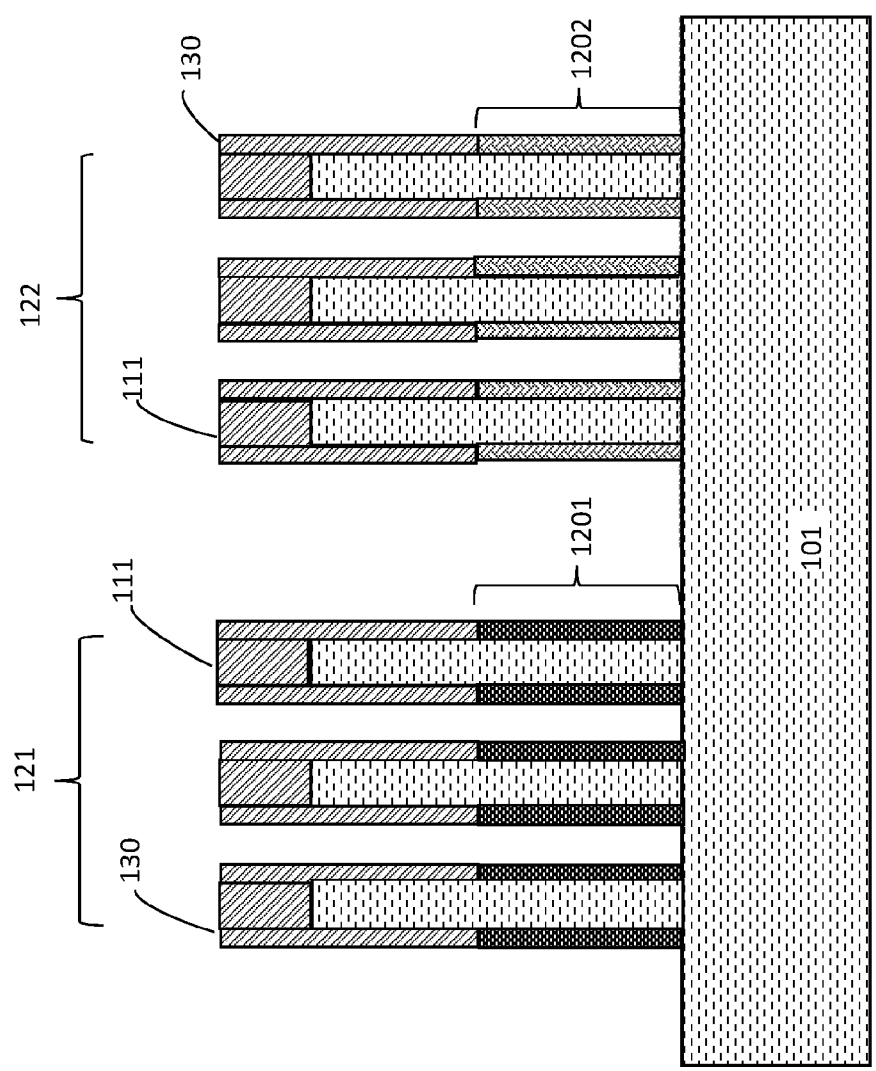

FIGS. 12-15 illustrate an exemplary method of a making semiconductor device according to a third embodiment of the present invention. FIG. 12 is a cross-sectional side view after etching to recess the p-doped oxide 210 (first doped oxide) and the n-doped oxide (second doped oxide) and leave spacers 1201, 1202 around a portion of fins shown in FIG. 4. The etching process is employed before annealing to drive in the dopants. The etching process may a dry etching process, for example, an RIE process.

The spacers 1201, 1202 form along sidewalls of the fins 110 and are single layer spacers. The spacer 1201 in the NFET region 120 includes the p-doped oxide 210. The spacer 1202 in the PFET region 121 includes the n-doped oxide 410. The spacers 1201, 1202 are formed between the spacers 130 and the substrate 101.

Figure 13:
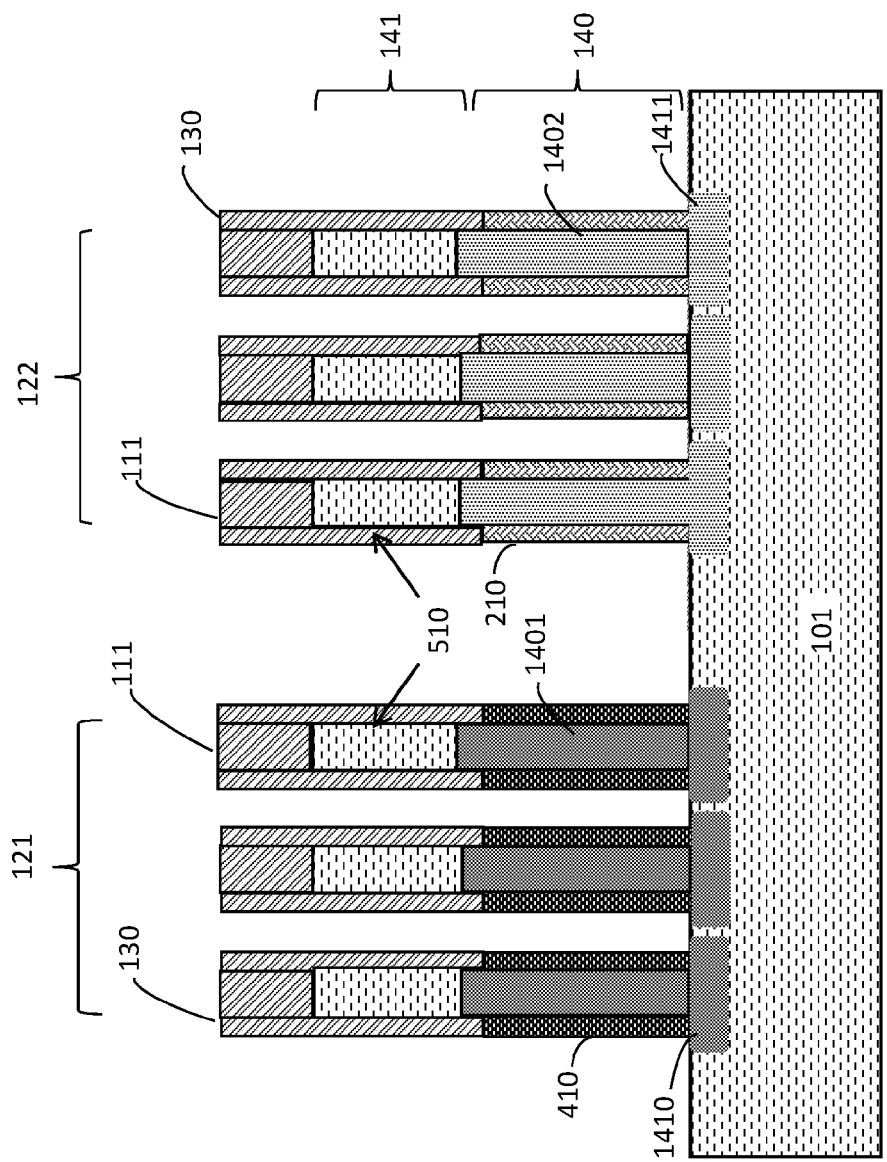

FIG. 13 is a cross-sectional side view after annealing to drive the dopants into the fins 110 and the substrate 101. A thermal annealing process may be employed as described above in FIG. 6 to drive the p-type dopants and the n-type dopants of the p-doped oxide 210 and the n-doped oxide 410, respectively, into the exposed fin regions to form doped fin regions 1401, 1402. The dopants are also driven into the substrate 101 to from corresponding doped substrate regions 1410, 1411. The doped fin regions 1401, 1402 and doped substrate regions 1410, 1411 form the PTS regions.

The doped fin regions 1401, 1402 and doped substrate regions 1410, 1411 will be doped with the type of dopant within the overlaying doped oxide layer. For example, the p-type dopants from the p-doped oxide 210 will be driven into fins 110 and substrate 101 of the NFET 121. The n-type dopants from the n-doped oxide 410 will be driven into the fins 110 and substrate 101 of the PFET 122.

The doped substrate regions 1410, 1411 include a gradient dopant profile. In contrast to embodiments one and two (see, e.g., FIGS. 5 and 9) the doped substrate regions 1410, 1411 are smaller and may be discrete (compare doped substrate regions 503, 504), which means that less dopants are in the substrate 101 because the p-doped oxide 210 and n-doped oxide 410 are removed (see FIG. 12) before annealing.

The fin channels 510 are protected by the spacers 130 and remain undoped. The spacers 130 function as a diffusion barrier in the region 141 of the fins 110. Thus, the dopants are only driven into the fins 110 in the region 140 not protected by the spacers 130.

Figure 14:
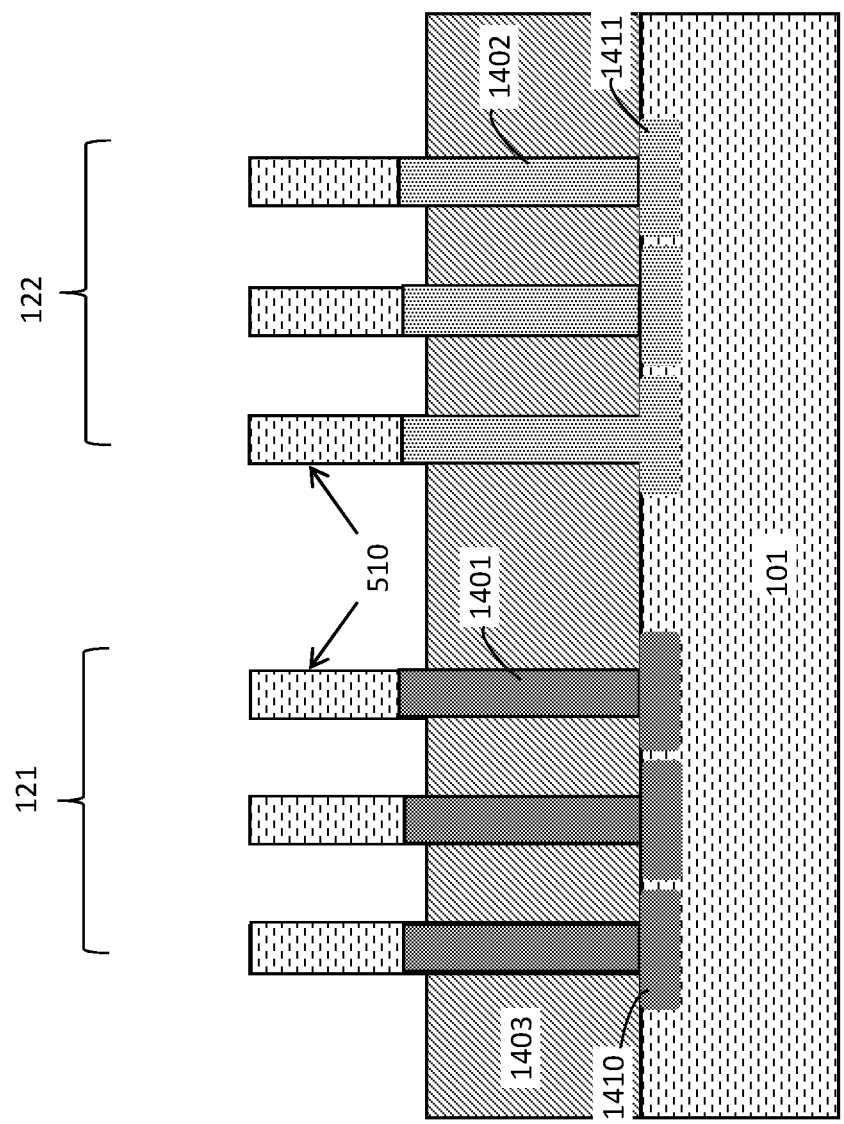

FIG. 14 is a cross-sectional side view after removing the spacers 1401, 1402 and hard mask 111 and depositing an undoped oxide 1403 around the fin channels 510. In some embodiments, the spacers 1401, 1402 are not removed and the undoped oxide 1403 is deposited over the spacers 1402, 1402.

The undoped oxide 1401 may include any suitable materials described above in FIG. 7A for the undoped oxide 701. A planarization process, for example, chemical mechanical planarization (CMP), is performed to smooth the surface of updoped oxide 1401. The undoped oxide 1401 is recessed and the spacers 130 and hard mask 111 are stripped also as described above in FIG. 7B.

Figure 15:
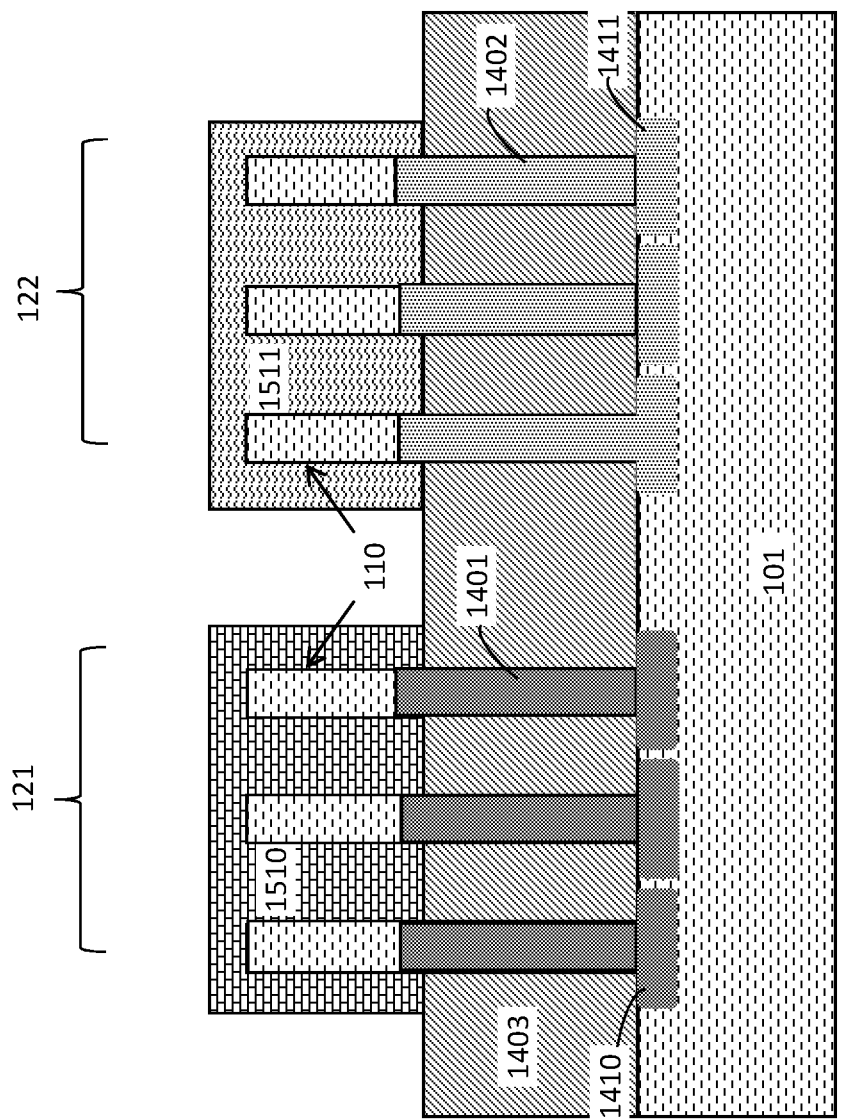

FIG. 15 is a cross-sectional side view after forming gates 1510, 1511 over the fins channels 510. The gates 1510, 1511 may include gate stacks as described above for gates 810, 811 in FIG. 8.

As described above, embodiments of the present invention provide methods of making semiconductor devices with several advantages. Embodiments of the present invention provide methods of making semiconductor devices with a dual doped STI liner. The methods only need a single mask for patterning. The methods do not include etching materials through the entire depth of high aspect ratio STIs. The methods also do not include depositing a capping layer onto doped oxide. Embodiments of the inventive structure and methods are suitable for highly scaled fin pitch devices.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
   forming a first fin of a first transistor in a substrate;
   forming a second fin of a second transistor in the substrate;
   disposing a first doped oxide layer comprising a first dopant onto the first fin and the second fin, the first dopant being an n-type dopant or a p-type dopant;
   disposing a mask over the first fin and removing the first doped oxide layer from the second fin;
   removing the mask and disposing a second doped oxide layer directly onto the first doped oxide layer covering the first fin and directly onto the second fin, the second doped oxide layer comprising an n-type dopant or a p-type dopant that is different than the first dopant; and annealing to drive in the first dopant into a portion of the first fin and the second dopant into a portion of the second fin.

2. The method of claim 1, wherein the first fin and the second fin further comprise a hard mask cap and a sidewall spacer.

3. The method of claim 1, wherein the first doped oxide layer has a thickness in a range from about 3 to about 30 nanometers (nm).

4. The method of claim 1, further comprising recessing the first doped oxide and the second doped oxide to form a doped oxide spacer along a portion of a sidewall of the first fin.

5. The method of claim 4, wherein the doped oxide spacer comprises a bilayer of the first doped oxide layer and the second doped oxide layer, the first doped oxide layer being adjacent to the first fin, and second doped oxide layer forms a single layer spacer disposed onto another portion of the sidewall.

6. The method of claim 5, wherein recessing the second doped oxide forms a doped oxide spacer comprising the second doped oxide layer along a sidewall of the second fin.

7. The method of claim 6, further comprising filling a region between the first and second fins with an undoped oxide.

8. The method of claim 1, further comprising removing the first and second doped oxide layer from around the first and second fins, and filling a region between the first and second fins with an undoped oxide.

9. The method of claim 1, wherein the first or second transistor further comprise a third fin adjacent to the first or second fin, and the first doped oxide layer or the second doped oxide layer pinches off between the third fin and either the first or second fin.

10. A method of making a semiconductor device, the method comprising:

forming a first fin of a first transistor in a substrate, the first fin having a hard mask arranged on a surface of the first fin and spacers arranged on sidewalls of the first fin;

forming a second fin of a second transistor in the substrate, the second fin having a hard mask arranged on a surface of the second fin and a spacer arranged on a sidewall of the second fin;

removing a portion of the substrate around the first fin to extend a height of the first fin and form a gap between the spacer on the sidewall of the first fin and the substrate;

removing a portion of the substrate around the second fin to extend a height of the second fin and form a gap between the spacer on the sidewall of the second fin and the substrate;

disposing a first doped oxide layer comprising a first dopant onto the first fin and the second fin such that the first doped oxide layer is arranged within the gap between the spacer and the substrate of the first fin and within the gap between the spacer and the substrate of the second fin, the first dopant being an n-type dopant or a p-type dopant;

disposing a mask over the first fin and removing the first doped oxide layer from the second fin;

removing the mask and disposing a second doped oxide layer directly onto the first doped oxide layer over the first fin and directly onto the second fin such that the second doped oxide layer is arranged within the gap between the spacer and the substrate of the second fin, the second doped oxide layer comprising an n-type dopant or a p-type dopant that is different than the first dopant;

recessing the first doped oxide and the second doped oxide to form a first doped oxide spacer along a sidewall of the first fin and a second doped oxide spacer along a sidewall of the second fin; and annealing to drive in the first dopant into a portion of the first fin and the second dopant into a portion of the second fin.

11. The method of claim 10, wherein the first doped oxide spacer comprises the first doped oxide layer, and the second doped oxide spacer comprises the second doped oxide layer.

12. The method of claim 10, wherein annealing drives the first dopant and the second dopant into the substrate to form doped substrate regions.

13. The method of claim 10, wherein the first or second fin further comprises a sidewall spacer adjacent to a fin channel region that prevents diffusion of the first or second dopant into the fin channel region.

14. The method of claim 10, further comprising disposing an undoped oxide between the first and second fins after annealing.

15. The method of claim 10, further comprising disposing an undoped oxide between the first and second fins before annealing.

* * * * *